United States Patent
Flanagan et al.

(10) Patent No.: US 6,594,476 B1
(45) Date of Patent: Jul. 15, 2003

(54) ADAPTIVELY PEAKED SUPER-REGENERATIVE FILTER

(75) Inventors: Robert C. Flanagan, Thousand Oaks, CA (US); Mark B. Bahu, Ventura, CA (US)

(73) Assignee: American Nucleonics Corporation, Westlake Village, CA (US)

( * ) Notice: Subject to any disclaimer, the term of this patent is extended or adjusted under 35 U.S.C. 154(b) by 409 days.

(21) Appl. No.: 09/631,015

(22) Filed: Aug. 2, 2000

Related U.S. Application Data

(60) Provisional application No. 60/156,090, filed on Sep. 24, 1999.

(51) Int. Cl.$^7$ .................................................. H04B 1/06
(52) U.S. Cl. .................................. 455/278.1; 455/296
(58) Field of Search ......................... 455/278.1, 296, 455/63, 39, 283; 338/12, 17.1; 330/129, 149, 294; 708/300, 323, 312, 303, 309

(56) References Cited

U.S. PATENT DOCUMENTS

| | | | |
|---|---|---|---|
| 5,117,505 A | 5/1992 | Talwar | |
| 5,140,699 A | 8/1992 | Kozak | |
| 5,148,117 A | 9/1992 | Talwar | |
| 5,152,010 A | 9/1992 | Talwar | |
| 5,428,831 A | 6/1995 | Monzello et al. | |
| 5,548,838 A | 8/1996 | Talwar et al. | |
| 5,574,978 A | 11/1996 | Talwar et al. | |
| 5,584,065 A | 12/1996 | Monzello | |
| 5,617,060 A | * 4/1997 | Wilson et al. | ............... 330/129 |

* cited by examiner

*Primary Examiner*—Nguyen T. Vo
*Assistant Examiner*—Tu Nguyen
(74) *Attorney, Agent, or Firm*—Gerald T. Bodner

(57) ABSTRACT

In accordance with one form of the present invention, an Adaptively Peaked Super-Regenerative Filter (APSRF) is provided, which preferably includes an interference suppression system (ISS), a summing block, a phase splitter, one or more variable attenuators, three couplers, an amplifier and a filter. The APSRF provides for significant narrowing of the bandwidth and a significant increase in the SNR and Q transfer function of the filter. The output of the amplifier or filter is sampled by one of the couplers and used as a reference sample signal to the ISS. The ISS includes an adaptive loop, which adjusts the reference sample signal in phase and amplitude to form a replica signal. The replica signal is designed to cancel an input sample signal taken from another coupler and applied to the summing block. An output of the summing block provides an error sample signal to the ISS, which enables the ISS to adaptively optimize the nulling function by adjusting the amplitude and phase of the replica signal. The phase splitter provides a copy of the replica signal having a 180-degree phase shift. This copy is in phase with the input signal, and provides a positive or regenerative feedback signal, which is coupled to the input signal. The copy of the replica signal is passed through a variable attenuator, and by varying the magnitude of the regenerative feedback, the degree of bandwidth reduction can be adjusted over a broad range.

30 Claims, 2 Drawing Sheets

ADAPTIVELY PEAKED SUPER-REGENERATIVE FILTER

CROSS-REFERENCE TO RELATED APPLICATION

This application is based on U.S. Provisional Patent Application Serial No. 60/156,090, which was filed on Sep. 24, 1999, the disclosure of which is incorporated herein by reference.

BACKGROUND OF THE INVENTION

1. Field of the Invention

This invention relates generally to electronic filters, and more particularly to techniques which may be applied to various conventional filter circuits, such as lumped element filters and cavity filters, to achieve a narrower bandwidth and a higher signal-to-noise ratio and Q transfer function than would normally be attainable using conventional filtering techniques.

2. Description of the Prior Art

An electronic filter is a combination of lumped or distributed circuit elements arranged to have frequency characteristics such that some frequencies are passed while others are blocked. Filters provide an effective means for the reduction and suppression of electromagnetic interference as the spectral content of the signal passed is controlled. The application of filtering techniques requires careful consideration of an extensive list of factors including insertion loss, impedance, power handling capability, signal distortion, tunability, cost, weight, size and the rejection of undesired signals. Often, filters are used as stopgap measures, but if suppression techniques are used early in the design process, the complexity and cost of interference reduction can be minimized.

The types of filters are classified according to the band of frequencies to be transmitted or attenuated. The basic types include low-pass, high-pass, band pass and bandstop (reject). Filters can include lumped, distributed or dissipative elements; the type used is primarily a function of the desired frequency.

Generally, it is best to filter signals at the source of interference, suppress all spurious signals, design filters such that they are essentially independent of environmental variables such as temperature and humidity, and ensure that all filter elements interface properly with other electromagnetically compatible (EMC) elements (which typically involves properly mounting the filter in a shielded enclosure). Filters using lumped and distributive elements are generally reflective, in that the various component combinations are designed for high series impedance and low shunt impedance in the stop band while providing low series impedance and high shunt impedance in the pass band.

In most cases, a spectrum of the input signal seen by a conventional filter is dominated by a desired signal, which is surrounded by undesirable sideband noise and extraneous interference. Under such circumstances, a center frequency of the filter is adjusted to approximate the frequency of the desired signal, and the bandwidth is narrowed to a width that just passes the desired signal and rejects unwanted sideband energy. In many instances, however, the components included in conventional filters cannot be adjusted to such a fine degree as to remove all unwanted sideband contributions. In addition, such adjustments to the components may include extensive and disruptive changes in components, which greatly impact the size and weight of the resulting circuit.

OBJECTS AND SUMMARY OF THE INVENTION

It is an object of the present invention to provide a practical apparatus and method, which can modify the bandwidth and increase the Q transfer function of conventional filters without significantly impacting the size, weight and design of the resulting circuit.

It is another object of the present invention to provide an apparatus and method which can readily be applied to conventional filters to reject noise, interference and spurious signals outside the bandwidth of a desired input signal that exhibits static or dynamic frequencys.

It is yet another object of the present invention to provide an apparatus and method to reject noise, interference and spurious signals in conventional filters outside the bandwidth of a desired input signal, which can readily be reconfigured to achieve variations in noise and dynamic range capability.

It is a further object of the present invention to provide an apparatus and method for rejecting noise, interference and spurious signals in conventional filters outside the bandwidth of a desired input signal having a gain that is selectable according to a chosen bandwidth.

In accordance with one form of the present invention, an Adaptively Peaked Super-Regenerative Filter (APSRF) is provided, which includes an Interference Suppression System (ISS), a summing block, a phase splitter, one or more variable attenuators, three couplers, an amplifier and a conventional filter. The APSRF provides for significant narrowing of the bandwidth and an increase in the signal-to-noise ratio (SNR) and Q transfer function of the filter.

An output signal taken from the filter is sampled by one of the couplers and used as a reference sample signal to the ISS. The ISS includes an adaptive loop, which adjusts the reference sample signal in phase and amplitude to generate a replica signal. The replica signal is designed to cancel an input sample signal coupled from the input signal and applied to the summing block. An output of the summing block provides an error sample signal back to the ISS, which enables the ISS to adaptively optimize its nulling function by adjusting the amplitude and phase of the replica signal.

A copy of the replica signal having a 180-degree phase shift is provided by the phase splitter. This copy is in phase with the input signal, and enables a positive or regenerative feedback of the input signal. The copy of the replica signal is also passed through the variable attenuator, and by altering the magnitude of the regenerative feedback via the variable attenuator, the degree of bandwidth reduction can be adjusted over a broad range. As the bandwidth of the ASPRF 10 is increased or decreased, the regenerative gain of the overall circuit varies. These variations can be reduced by the addition of a second variable attenuator coupled to the output of the filter.

These and other objects, features and advantages of the present invention, will become apparent from the following detailed description of illustrative embodiments thereof, which is to be read in conjunction with the accompanying drawings.

DETAILED DESCRIPTION OF THE PREFERRED EMBODIMENTS

An Adaptively Peaked Super-Regenerative Filter (APSRF) enables significant and variable narrowing of the bandwidth associated with a conventional electronic filter. The techniques of the present invention may be applied to various conventional filter implementations, such as lumped element filters and cavity filters, to achieve a narrower bandwidth and a higher signal-to-noise ratio (SNR) and Q transfer function than would have been attainable using conventional filter techniques alone. The APSRF can readily be applied in an entirely unobtrusive manner to an existing conventional filter as shown in FIG. 1.

The present invention essentially includes three distinct concepts and a combination of these concepts. The first concept involves the application of regenerative gain to the conventional filter. The regenerative gain functions to narrow the bandwidth and increase the SNR and Q transfer function of the filter.

The second concept involves the use of an adaptive, null-seeking control loop. Such a control loop functions to adjust the amplitude and phase of the regenerative gain such that it reasonably approximates the desired input signal. The phase of the regenerative gain is preferably maintained relatively constant to the input signal, and the amplitude of the regenerative gain preferably approximates but is less than the amplitude of the input signal (i.e., unity gain) for a given degree of bandwidth narrowing. The amplitude is preferably less than the amplitude of the input signal to avoid oscillatios in the control loop as a result of unity gain. The present invention places the criticality of maintaining the regenerative gain primarily in passive components. The third concept involves the use of an attenuator, which functions to vary the extent to which the bandwidth of the conventional filter is narrowed.

Figure 1:
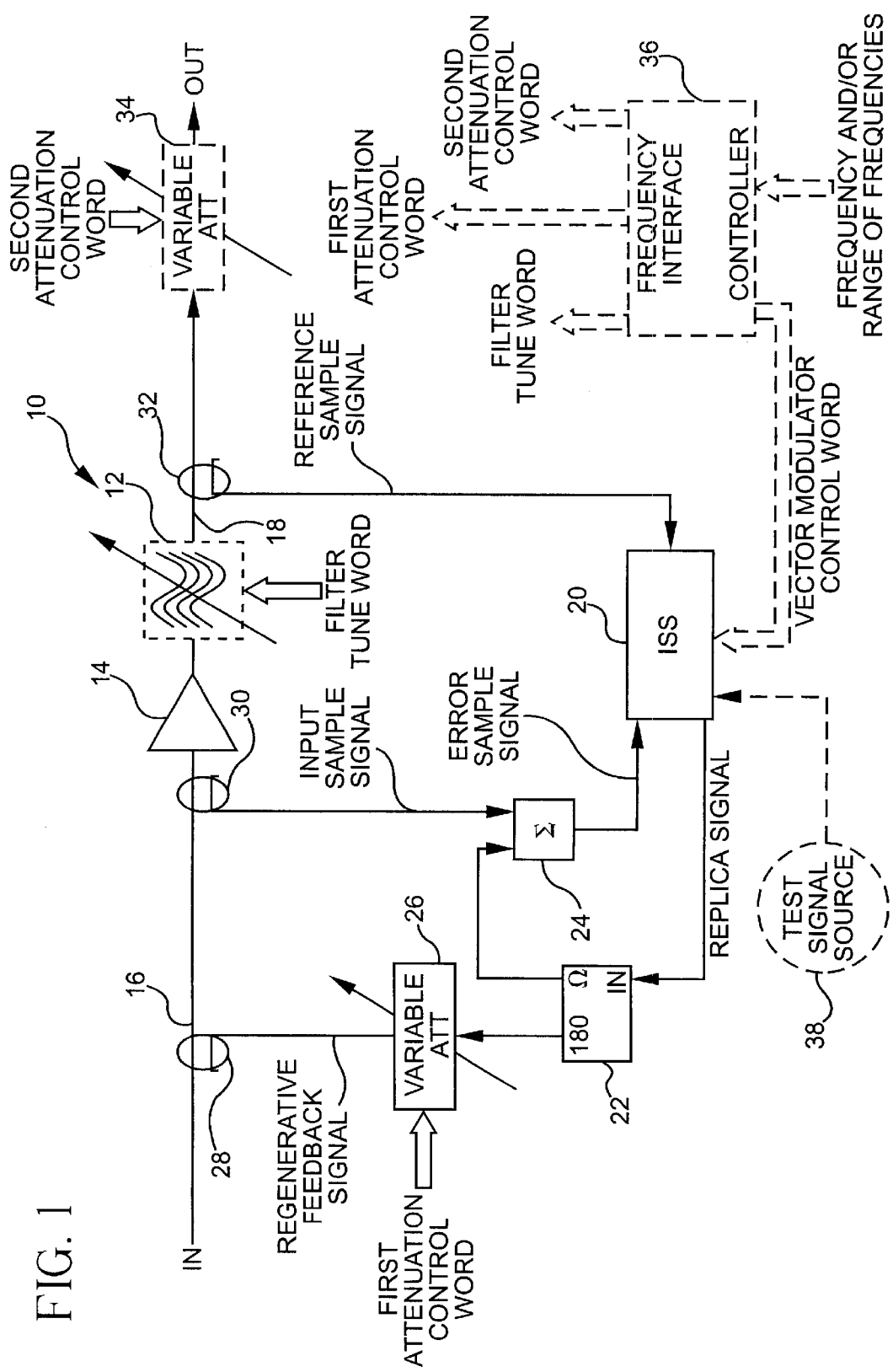
FIG. 1 is a block diagram of an Adaptively Peaked Super-Regenerative Filter (APSRF) formed in accordance with the present invention.

FIG. 1 illustrates a combination of the three concepts discussed above in the APSRF 10 formed in accordance with the present invention. The conventional portion of the APSRF 10 preferably includes an amplifier 14 having an input and an output and a tunable filter 12 having an input and an output. An input signal 16 is preferably applied to the input of the amplifier 14, and the output of the amplifier 14 is preferably coupled to the input of the tunable filter 12. The output of the tunable filter 12 provides an output signal 18. The APSRF 10 also includes an Interference Cancellation or Suppression System (ISS) 20, a phase splitter 22, a summing block 24, a first variable attenuator 26 and first, second and third couplers 28, 30, 32, respectively.

The connectivity between the elements of the APSRF 10 will now be described. The third coupler 32 is coupled to the output signal 18 and a first input of the ISS 20. An output of the ISS 20 is coupled to an input of the phase splitter 22, and a second input of the ISS 20 is coupled to an output of the summing block 24. A first output of the phase splitter 22 is coupled to an input of the first variable attenuator 26. An output of the first variable attenuator 26 is coupled to the first coupler 28, and the first coupler 28 is coupled to the input signal 16. A second output of the phase splitter 22 is coupled to a first input of the summing block 24. A second input of the summing block 24 is coupled to the second coupler 30, and the second coupler 30 is coupled to the input signal 16. The second coupler 30 provides an input sample signal to the summing block 24, and the first coupler 28 provides a regenerative feedback signal to the input signal 16

The first coupler 28, the second coupler 30 and the amplifier 14 establish a noise figure for the APSRF 10 shown in FIG. 1. The output signal 18 from the tunable filter 12 is sampled by the third coupler 32, and the output of the third coupler 32 provides a reference sample signal to the ISS 20.

The ISS 20 preferably includes an adaptive loop, which adjusts the reference sample signal in amplitude and phase such that the replica signal substantially cancels the input sample signal obtained from the second coupler 30. The conventional interference suppression system shown in greater detail in FIG. 2 includes a fourth coupler 21 coupled to the error sample signal and a signal controller 23. The ISS 20 also includes a synchronous detector 25, which is responsive to the reference sample signal.

The synchronous detector 25 is coupled to both the error sample signal via the fourth coupler 21 and the reference sample signal. The synchronous detector 25 compares the reference sample signal with the error sample signal and essentially detects that portion of the reference sample signal (i.e., the interfering signal component) which is coherent with the error sample signal. The synchronous detector 25 then provides output signals on its output ports which correspond to differences in amplitude and phase between the error sample signal and the coherent signal component of the reference sample signal. The conventional ISS 20 also includes amplifiers and/or integrators 27, which are coupled to the outputs of the synchronous detector 25 to provide control signals which are then provided to the signal controller 23.

The signal controller 23, also commonly known as a vector modulator, is regulated by the control signals from the synchronisous detector 25 via the amplifier/integrators 27. As previously described, the error sample signal is provided to an input of the signal controller 23, and an output port of the signal controller 23 provides the replica signal, which is output to the phase splitter 22. The replica signal generated by the signal controller 23 is operatively coupled to the input signal 16 via the phase splitter 22, the first attenuator 26 and the first coupler 28. Essentially, when coupled to the input signal, the replica signal enhances the desirable non-interfering signal component of the input signal 16.

Figure 2:
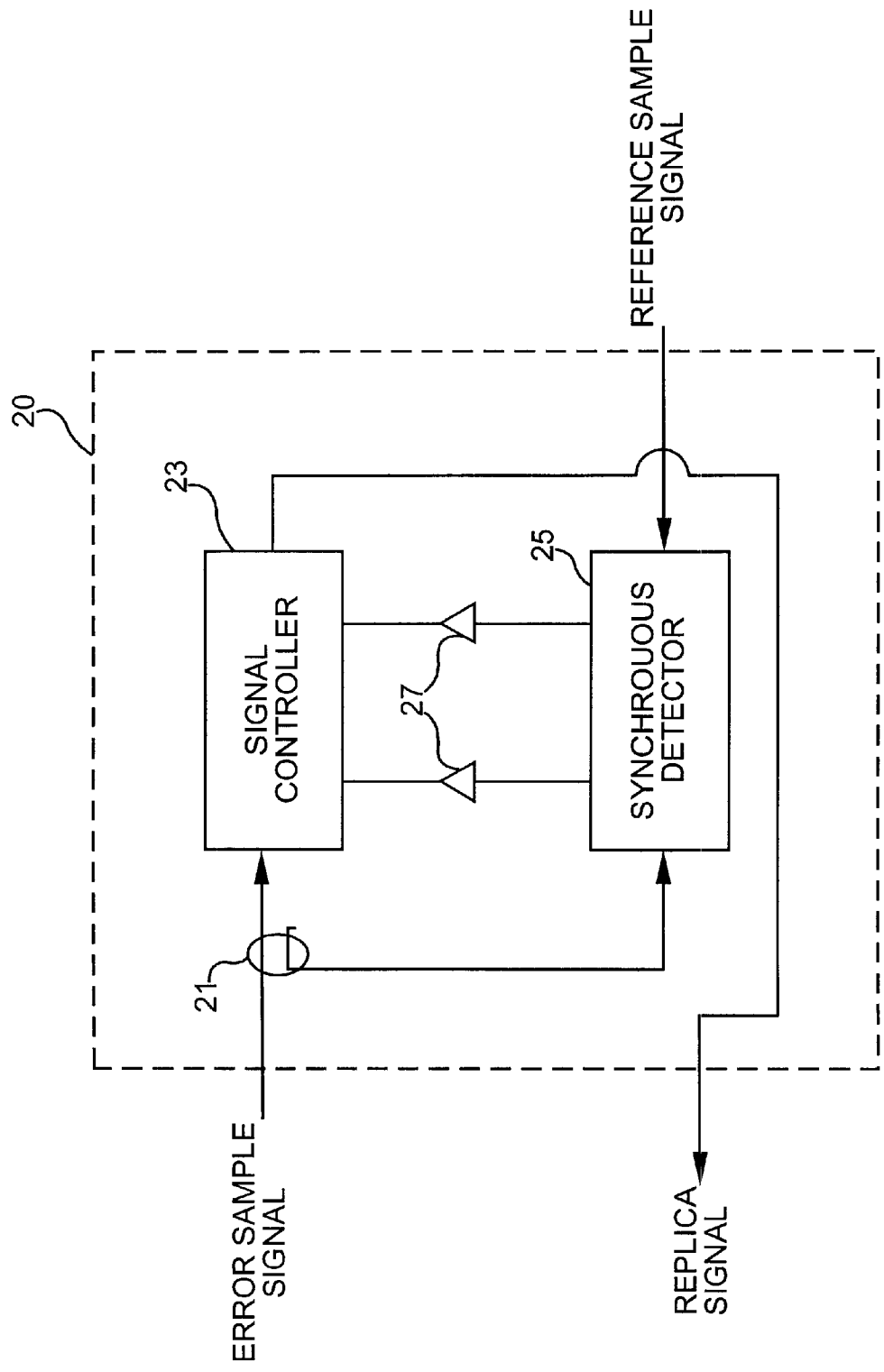
FIG. 2 is a block diagram of a conventional Interference Suppression System (ISS) for use in the APSRF formed in accordance with the present invention.

In the conventional ISS 20 shown in FIG. 2, the signal controller 23 and the synchronous detector 25 are typically quadrature devices. Quadrature vector modulators are commonly used in interference cancellation systems to adjust the amplitude and phase of the reference signal, which is then injected as a cancellation or replica signal into the receiver system to minimize an interfering signal or regenerate the input or received signal. Additional information concerning the design and functional operation of the ISS 20 can be found in U.S. Pat. Nos. 5,548,838; 5,584,065; 5,574,978; 5,148,117; 5,140,699; 5,117,505; 5,428,831 and 5,152,010, the relevant portions of which are hereby incorporated by reference.

The output of the summing block 24 is coupled to the ISS 20 and provides an error sample signal. The error sample signal enables the ISS 20 to adaptively optimize its nulling function via adjustment of the amplitude and phase of the replica signal, which is then outputted to the phase splitter 22. The amplitude and phase are adjusted to enable the replica signal to coherently couple to the input signal 16. In order to maintain effective regeneration of the input signal 16, phase alignment of the replica signal with the input signal is preferred. To ensure adequate phase alignment of the replica and input signals, the bandwidth is preferably narrow.

A second copy of the replica signal is provided from the first output of the phase splitter 22. The second copy is shifted 180 degrees by the phase splitter 22 such that it is in phase with the input signal 16 and provides a positive or regenerative feedback signal. The regenerative feedback signal is coupled to the input signal 16 through the first variable attenuator 26 via the first coupler 28. By adjusting the first variable attenuator 26 over a magnitude of preferably about −10 dB to about −0.1 dB, the degree of bandwidth reduction can be adjusted from about 80 percent of the original bandwidth to about 1/200th of the original bandwidth.

The gain of the amplifier 14 is chosen such that it is sufficient to overcome losses introduced by the tunable filter 12, the first, second and third couplers 28, 30, 32, the phase splitter 22 and the ISS 20. The gain of the amplifier 14 preferably creates a regenerative feedback of about unity to avoid oscillation of the control loop.

The embodiment shown in FIG. 1 is the preferred implementation of the present invention provided the spectrum of the input signal 16 is dominated by a desired input signal, and a narrow bandwidth filter is required to remove undesirable sideband noise and extraneous spectrum content. Alternatively, in an application, such as a radio receiver where the spectrum of the input signal 16 may include signals at other valid but different frequencies, an alternative embodiment is preferred.

In such an embodiment, the settings for the signal controller 23 shown in FIG. 2 may be adjusted in accordance with a look-up table. The entries in the look-up table preferably depend on a center frequency of the desired input signal as represented by an optional vector modulator control word. The vector modulator control word is preferably outputted from an optional frequency interface controller 36 based upon the frequency and/or range of frequencies of the desired input signal.

Calibration of the look-up table is preferably performed as a one-time process during factory setup, but could be performed repeatedly by incorporating an optional test signal source 38 coupled to the ISS 20. For example, the test signal source 38 could be tuned to the frequency of the desired input signal and the ISS 20 would then adaptively search for the appropriate amplitude and phase settings required to replicate the test signal. Once determined, the settings could preferably be stored for subsequent open loop operation.

Additional embodiments of the present invention can be derived by moving the amplifier 14 and the tunable filter 12 to different locations around the feedback loop. The configurations resulting from such modifications may display variations in noise and dynamic range capability that are of varying importance in different applications.

As the bandwidth of the APSRF 10 is increased or decreased, the regenerative gain of the overall circuit varies. These variations can preferably be reduced by a second variable attenuator 34 coupled to the output of the loop following the third coupler 32.

The optional frequency interface controller 36 preferably inputs a particular frequency or range of frequencies desired and outputs an appropriate filter tune word, first attenuation control word and second attenuation control word to obtain the desired characteristics of operation such as bandwidth, gain and Q. As shown in FIG. 1, the filter tune word is outputted to the tunable filter 12, and the first and second attenuation control words are outputted to the first and second variable attenuators 26, 34, respectively. The controller 36 preferably includes components such as a microprocessor, microcontroller, application specific integrated circuit (ASIC) and memory for storing a software algorithm and/or lookup table that determines the appropriate settings for the variable attenuators 26, 34 and tunable filter 12 given the desired frequency or range of frequencies.

From the foregoing description, it will be appreciated by those skilled in the art that a method and apparatus formed in accordance with the present invention can modify the bandwidth and increase the SNR and Q transfer function of conventional filters while not significantly impacting their size, weight and design. Such a method and apparatus can also readily be applied to conventional filters to reject noise, interference and spurious signals outside the bandwidth of the desired input signal.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. An electronic filter system, the electronic filter system comprising:
    an amplifier, the amplifier having a gain equal to one of less than unity, unity and greater than unity, the amplifier being responsive to an input signal, the amplifier outputting an amplified input signal;
    an electronic filter, the electronic filter being responsive to at least one of the input signal and the amplified input signal;
    an interference suppression circuit, the interference suppression circuit generating a replica signal from a reference sample signal and an error sample signal, the reference sample signal being representative of the amplified input signal, the error sample signal being representative of differences between the replica signal and an input sample signal, the input sample signal being representative of the input signal, the replica signal having substantially the same phase and amplitude as the input sample signal; and
    a first coupler, the first coupler coupling the replica signal to the input signal.

2. An electronic filter system as defined by claim 1, further comprising a first attenuator, the first attenuator selectively attenuating the replica signal, the first attenuator having an attenuation of one of less than unity, unity, and greater than unity.

3. An electronic filter system as defined by claim 1, wherein the interference suppression circuit includes a signal controller and a synchronous detector, the signal controller being responsive to the error sample signal, the synchronous detector being responsive to the error sample signal and the reference sample signal, the synchronous detector generating at least one control signal, the signal controller being responsive to the at least one control signal, the signal controller generating the replica signal, the signal controller being able to adjust at least one of the phase and amplitude of the replica signal in response to the at least one control signal such that the replica signal substantially cancels the input sample signal.

4. An electronic filter system as defined by claim 1, further comprising a second attenuator, the second attenuator being responsive to the amplified output signal, the second attenuator having an attenuation of one of less than unity, unity, and greater than unity.

5. An electronic filter system as defined by claim 1, further comprising a second coupler, the second coupler coupling the amplified input signal to the reference sample signal.

6. An electronic filter system as defined by claim 1, further comprising a third coupler, the third coupler coupling the input signal to the input sample signal.

7. An electronic filter system as defined by claim 1, further comprising a frequency interface controller, the frequency interface controller inputting frequency information and outputting a filter tune word, the frequency information being representative of at least one frequency in the desired bandwidth, the filter tune word being able to control the electronic filter such that the amplified output signal is within the desired bandwidth.

8. An electronic filter system as defined by claim 2, further comprising a frequency interface controller, the frequency interface controller inputting frequency information and outputting a first attenuation control word, the frequency information being representative of at least one frequency in the desired bandwidth, the first attenuation control word being able to control the first attenuator.

9. An electronic filter system as defined by claim 4, further comprising a frequency interface controller, the frequency interface controller inputting frequency information and outputting a second attenuation control word, the frequency information being representative of at least one frequency in the desired bandwidth, the second attenuation control word being able to control the second attenuator.

10. A regenerative feedback system for an electronic filter, regenerative feedback system comprising:
    an amplifier, the amplifier having a gain equal to one of less than unity, unity and greater than unity, the amplifier being responsive to an input signal, the amplifier outputting an amplified input signal;
    an interference suppression circuit, the interference suppression circuit generating a replica signal from a reference sample signal and an error sample signal, the reference sample signal being representative of the amplified input signal, the error sample signal being representative of differences between the replica signal and an input sample signal, the input sample signal being representative of the input signal, the replica signal having substantially the same phase and amplitude as the input sample signal; and
    a first coupler, the first coupler coupling the replica signal to the input signal.

11. A regenerative feedback system for an electronic filter as defined by claim 10, further comprising a first attenuator, the first attenuator selectively attenuating the replica signal, the first attenuator having an attenuation of one of less than unity, unity, and greater than unity.

12. A regenerative feedback system for an electronic filter as defined by claim 10, wherein the interference suppression circuit includes a signal controller and a synchronous detector, the signal controller being responsive to the error sample signal, the synchronous detector being responsive to the error sample signal and the reference sample signal, the synchronous detector generating at least one control signal, the signal controller being responsive to the at least one control signal, the signal controller generating the replica signal, the signal controller be able to adjust at least one of the phase and amplitude of the replica signal in response to the at least one control signal such that the replica signal substantially cancels the input sample signal.

13. A regenerative feedback system for an electronic filter as defined by claim 10, further comprising a second attenuator, the second attenuator being responsive to the amplified output signal, the second attenuator having an attenuation of one of less than unity, unity, and greater than unity.

14. A regenerative feedback system for an electronic filter as defined by claim 10, further comprising a second coupler, the second coupler coupling the amplified input signal to the reference sample signal.

15. A regenerative feedback system for an electronic filter as defined by claim 10, further comprising a third coupler, the third coupler coupling the input signal to the input sample signal.

16. A method of electronically filtering an input signal within a desired bandwidth, the method comprising the steps of:
    amplifying the input signal, the input signal being amplified by a gain equal to one of less than unity, unity and greater than unity;
    filtering at least one of the input signal and the amplified input signal electronically;
    generating a replica signal from a reference sample signal and an error sample signal, the reference sample signal being representative of the amplified input signal, the error sample signal being representative of differences between the replica signal and an input sample signal, the input sample signal being representative of the input signal, the replica signal having substantially the same phase and amplitude as the input sample signal; and
    coupling the replica signal to the input signal.

17. A method of electronically filtering an input signal within a desired bandwidth as defined by claim 16, further comprising the step of attenuating the replica signal selectively, the replica signal being attenuated by one of less than unity, unity, and greater than unity.

18. A method of electronically filtering an input signal within a desired bandwidth as defined by claim 16, wherein the step of generating the replica signal further comprises the steps of coupling the error sample signal to a signal controller, coupling the error sample signal and the reference sample signal to a synchronous detector, generating at least one control signal from the synchronous detector, coupling the at least one control signal to the signal controller, generating the replica signal from the signal controller, adjusting at least one of the phase and amplitude of the replica signal in response to the at least one control signal such that the replica signal substantially cancels the input sample signal.

19. A method of electronically filtering an input signal within a desired bandwidth as defined by claim 16, further comprising the step of attenuating the amplified output signal selectively, the amplified output signal being attenuated by one of less than unity, unity, and greater than unity.

20. A method of electronically filtering an input signal within a desired bandwidth as defined by claim 16, further comprising the step of coupling the amplified input signal to the reference sample signal.

21. A method of electronically filtering an input signal within a desired bandwidth as defined by claim 16, further comprising the step of providing a filter tune word in response to inputting frequency information, the frequency information being representative of at least one frequency in the desired bandwidth, the filter tune word being able to control the filtering of at least one of the input signal and the amplified input signal such that the amplified input signal is within the desired bandwidth.

22. A method of electronically filtering an input signal within a desired bandwidth as defined by claim 16, further comprising the step of coupling the input signal to the input sample signal.

23. A method of electronically filtering an input signal within a desired bandwidth as defined by claim 17, further comprising the step of providing a first attenuation control word in response to inputting frequency information, the frequency information being representative of at least one frequency in the desired bandwidth, the first attenuation control word being able to control the attenuation of the replica signal.

24. A method of electronically filtering an input signal within a desired bandwidth as defined by claim 19, further comprising the step of providing a second attenuation control word in response to inputting frequency information, the frequency information being representative of at least one frequency in the desired bandwidth, the second attenuation control word being able to control the attenuation of the amplified output signal.

25. A method of applying regenerative feedback to an input signal within a desired bandwidth for use with an electronic filter, the method comprising the steps of:

amplifying the input signal, the input signal being amplified by a gain equal to one of less than unity, unity and greater than unity;

generating a replica signal from a reference sample signal and an error sample signal, the reference sample signal being representative of the amplified input signal, the error sample signal being representative of differences between the replica signal and an input sample signal, the input sample signal being representative of the input signal, the replica signal having substantially the same phase and amplitude as the input sample signal; and coupling the replica signal to the input signal.

26. A method of applying regenerative feedback to an input signal within a desired bandwidth for use with an electronic filter as defined by claim 25, further comprising the step of attenuating the replica signal selectively, the replica signal being attenuated by one of less than unity, unity, and greater than unity.

27. A method of applying regenerative feedback to an input signal within a desired bandwidth for use with an electronic filter as defined by claim 25, wherein the step of generating the replica signal further comprises the steps of coupling the error sample signal to a signal controller, coupling the error sample signal and the reference sample signal to a synchronous detector, generating at least one control signal from the synchronous detector, coupling the at least one control signal to the signal controller, generating the replica signal from the signal controller, adjusting at least one of the phase and amplitude of the replica signal in response to the at least one control signal such that the replica signal substantially cancels the input sample signal.

28. A method of applying regenerative feedback to an input signal within a desired bandwidth for use with an electronic filter as defined by claim 25, further comprising the step of attenuating the amplified output signal selectively, the amplified output signal being attenuated by one of less than unity, unity, and greater than unity.

29. A method of applying regenerative feedback to an input signal within a desired bandwidth for use with an electronic filter as defined by claim 25, further comprising the step of coupling the amplified input signal to the reference sample signal.

30. A method of applying regenerative feedback to an input signal within a desired bandwidth for use with an electronic filter as defined by claim 25, further comprising the step of coupling the input signal to the input sample signal.

* * * * *